US012699192B2

(12) United States Patent
Shang et al.

(10) Patent No.: US 12,699,192 B2
(45) Date of Patent: Aug. 4, 2026

(54) DETECTION SUBSTRATE AND RAY DETECTOR

(71) Applicants: Beijing BOE Sensor Technology Co., Ltd., Beijing (CN); BOE Technology Group Co., Ltd., Beijing (CN)

(72) Inventors: Jianxing Shang, Beijing (CN); Zhenyu Wang, Beijing (CN); Zhenwu Jiang, Beijing (CN); Liyou Xiao, Beijing (CN)

(73) Assignees: Beijing BOE Sensor Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 417 days.

(21) Appl. No.: 18/016,273

(22) PCT Filed: Jan. 25, 2022

(86) PCT No.: PCT/CN2022/073856
§ 371 (c)(1),
(2) Date: Jan. 13, 2023

(87) PCT Pub. No.: WO2023/141773
PCT Pub. Date: Aug. 3, 2023

(65) Prior Publication Data
US 2024/0248217 A1 Jul. 25, 2024

(51) Int. Cl.
*G01T 1/20* (2006.01)
*H10F 39/18* (2025.01)

(52) U.S. Cl.
CPC ..... *G01T 1/20182* (2020.05); *H10F 39/1898* (2025.01)

(58) Field of Classification Search
CPC ........................ G01T 1/20182; H10F 39/1898
See application file for complete search history.

(56) References Cited

U.S. PATENT DOCUMENTS

| | | | | |
|---|---|---|---|---|
| 4,540,882 A | * | 9/1985 | Vinegar ................ | E21B 49/005 |
| | | | | 250/255 |
| 6,097,032 A | * | 8/2000 | Tanimori .............. | G01T 1/2935 |
| | | | | 250/374 |
| 6,380,603 B1 | * | 4/2002 | Takimoto .............. | H10F 77/957 |
| | | | | 257/E31.115 |

(Continued)

FOREIGN PATENT DOCUMENTS

| | | |
|---|---|---|
| CN | 106206636 A | 12/2016 |
| CN | 109860329 A | 6/2019 |

(Continued)

*Primary Examiner* — Blake C Riddick
(74) *Attorney, Agent, or Firm* — IPro, PLLC

(57) ABSTRACT

The disclosure provides a detection substrate and a ray detector, the detection substrate including a base substrate, an average atomic number of a material used for the base substrate being less than 30, a ray mass attenuation coefficient of the material used for the base substrate being positively correlated with power of 3-4 of the average atomic number, and the base substrate including a ray incident side; a photodiode on a side of the base substrate, and the side of the base substrate with the photodiode facing away from the ray incident side; and a scintillator layer on a side of the layer of the photodiode away from the base substrate.

14 Claims, 5 Drawing Sheets

(56) References Cited

U.S. PATENT DOCUMENTS

| | | | | |
|---|---|---|---|---|
| 7,465,933 B2* | 12/2008 | Ishii | ...................... | H10F 39/811 |
| | | | | 250/370.11 |
| 2004/0182265 A1* | 9/2004 | Saiki | ................... | H05K 3/4602 |
| | | | | 101/366 |
| 2007/0181780 A1* | 8/2007 | Suzuki | ................. | H10F 39/811 |
| | | | | 250/208.4 |
| 2008/0035857 A1* | 2/2008 | Struye | ..................... | G21K 4/00 |
| | | | | 250/458.1 |
| 2009/0057564 A1* | 3/2009 | Miyayama | ............. | G01T 1/241 |
| | | | | 257/292 |
| 2011/0317817 A1* | 12/2011 | Nishino | .................. | H05G 1/10 |
| | | | | 378/102 |
| 2012/0032088 A1* | 2/2012 | Ishii | ...................... | H10F 39/811 |
| | | | | 250/208.2 |
| 2012/0217404 A1* | 8/2012 | Iwakiri | .................. | G01T 1/202 |
| | | | | 250/361 R |
| 2012/0312995 A1* | 12/2012 | Morf | .................. | H10F 39/1898 |
| | | | | 250/363.01 |
| 2013/0048862 A1* | 2/2013 | Nakatsugawa | ....... | G01T 1/1642 |
| | | | | 438/69 |
| 2013/0140568 A1* | 6/2013 | Miyamoto | ............ | H10F 39/802 |
| | | | | 257/53 |
| 2013/0271532 A1* | 10/2013 | Sakai | ................. | H10N 30/8561 |
| | | | | 310/311 |
| 2015/0144889 A1* | 5/2015 | An | ........................ | G01T 1/2018 |
| | | | | 257/40 |
| 2015/0249197 A1* | 9/2015 | Shieh | .................. | H10H 20/857 |
| | | | | 438/34 |
| 2017/0256635 A1* | 9/2017 | Ogawa | ............. | H01L 21/02458 |
| 2017/0261621 A1* | 9/2017 | Nagata | ............... | G01T 1/20185 |
| 2019/0033470 A1* | 1/2019 | Ishii | .................... | A61B 6/4266 |
| 2019/0049597 A1* | 2/2019 | Tian | ..................... | H10F 39/811 |
| 2019/0196034 A1* | 6/2019 | Noguchi | ............... | G03B 42/02 |
| 2019/0212853 A1* | 7/2019 | Ma | .................... | H10D 86/0221 |
| 2020/0209413 A1* | 7/2020 | Kim | ..................... | G01T 1/2018 |
| 2020/0238284 A1* | 7/2020 | Meshot | ................ | C01B 32/168 |
| 2020/0379132 A1* | 12/2020 | Na | ........................ | G01T 1/2018 |
| 2020/0408938 A1* | 12/2020 | Iwakiri | ................ | G01T 1/2023 |
| 2021/0066439 A1* | 3/2021 | Kim | ..................... | H10K 59/38 |
| 2021/0135036 A1 | 5/2021 | Cho | | |
| 2021/0377463 A1* | 12/2021 | Ikeda | .................... | H04N 25/77 |

FOREIGN PATENT DOCUMENTS

| | | |
|---|---|---|
| CN | 110286400 A | 9/2019 |
| CN | 113611719 A | 11/2021 |
| JP | 2009162586 A | 7/2009 |

* cited by examiner

104(TFT)

DETECTION SUBSTRATE AND RAY DETECTOR

CROSS REFERENCE TO RELATED APPLICATIONS

This application is a national phase entry under 35 U.S.C. § 371 of International Application No. PCT/CN2022/073856, filed on Jan. 25, 2022, the entire content of which is incorporated herein by reference.

FIELD

The disclosure relates to the field of detection technology, in particular to a detection substrate and a ray detector.

BACKGROUND

An X-ray testing technology is widely used in industrial nondestructive testing, container scanning, circuit board inspection, medical treatment, security, industry and other fields, and has broad application prospects. A traditional X-Ray imaging technology uses analog signal for imaging, the resolution of the image is not high, and the image quality is poor. X-ray digital radio graphy (DR) method, which appeared in the late 1990s, uses X-ray detectors to directly convert X-ray images into digital images. The DR method has become a leading direction of a digital X-ray radiography technology and has been recognized by clinical institutions and imaging experts all over the word due to its obvious advantages, such as convenient operation, a high fast imaging speed, a high imaging resolution, clear converted digital images, and easy preservation and transmission of the digital images.

SUMMARY

A detection substrate and a ray detector are provided by embodiments of the disclosure, and a specific solution is as follows.

In one aspect, an embodiment of the disclosure provides a detection substrate, including:

a base substrate, an average atomic number of a material used for the base substrate being less than 30, a ray mass attenuation coefficient of the material used for the base substrate to rays being positively correlated with the power of 3-4 of the average atomic number, and the base substrate including a ray incident side;

a photodiode, on a side of the base substrate, where the side of the base substrate with the photodiode faces away from the ray incident side; and a scintillator layer, on a side of the layer of the photodiode away from the base substrate.

In some embodiments, in the detection substrate provided by the embodiment of the disclosure, the base substrate is a flexible substrate.

In some embodiments, in the detection substrate provided by the embodiment of the disclosure, a material of the flexible substrate includes at least one of polyimide, polyethylene glycol terephthalate, polyethylene naphthalate, polymethyl methacrylate, organic silica gel or resin.

In some embodiments, in the detection substrate provided by the embodiment of the disclosure, the flexible substrate includes a polyimide layer.

In some embodiments, in the detection substrate provided by the embodiment of the disclosure, the flexible substrate further includes a polyethylene glycol terephthalate layer, and the polyethylene glycol terephthalate layer is located on a side of the polyimide layer away from the layer of the photodiode.

In some embodiments, in the detection substrate provided by the embodiment of the disclosure, a thickness of the polyimide layer is less than 100 μm in a direction perpendicular to the base substrate.

In some embodiments, in the detection substrate provided by the embodiment of the disclosure, the base substrate is a rigid substrate.

In some embodiments, in the detection substrate provided by the embodiment of the disclosure, a thickness of the base substrate is less than or equal to 1000 μm in the direction perpendicular to the base substrate.

In some embodiments, in the detection substrate provided by the embodiment of the disclosure, a glass-transition temperature of the base substrate is greater than 200° ° C.

In some embodiments, in the detection substrate provided by the embodiment of the disclosure, the photodiode includes a first electrode, a photovoltaic conversion material layer and a second electrode arranged in stack, and the second electrode is adjacent to the scintillator layer.

In some embodiments, the detection substrate provided by the embodiment of the disclosure further includes a driving circuit, where the layer of the driving circuit is located between the base substrate and the layer of the first electrode, and the driving circuit is electrically connected with the first electrode.

In some embodiments, in the detection substrate provided by the embodiment of the disclosure, an orthographic projection of the driving circuit on the base substrate is located in an orthographic projection of the photovoltaic conversion material layer on the base substrate. In some embodiments, in the detection substrate provided by the embodiment of the disclosure, an orthographic projection of the driving circuit on the base substrate does not overlap an orthographic projection of the photovoltaic conversion material layer on the base substrate.

In some embodiments, in the detection substrate provided by the embodiment of the disclosure, the driving circuit includes an amorphous-silicon transistor, and the amorphous-silicon transistor is a top-gate transistor or a bottom-gate transistor.

In some embodiments, in the detection substrate provided by the embodiment of the disclosure, the driving circuit includes an oxide transistor, and the oxide transistor is a bottom-gate transistor.

In the other aspect, an embodiment of the disclosure provides a ray detector, including a detection substrate and a ray source, where the detection substrate is the above detection substrate provided by the embodiment of the disclosure, and rays emitted by the ray source irradiate into the detection substrate from the ray incident side.

DETAILED DESCRIPTION

Figure 1:
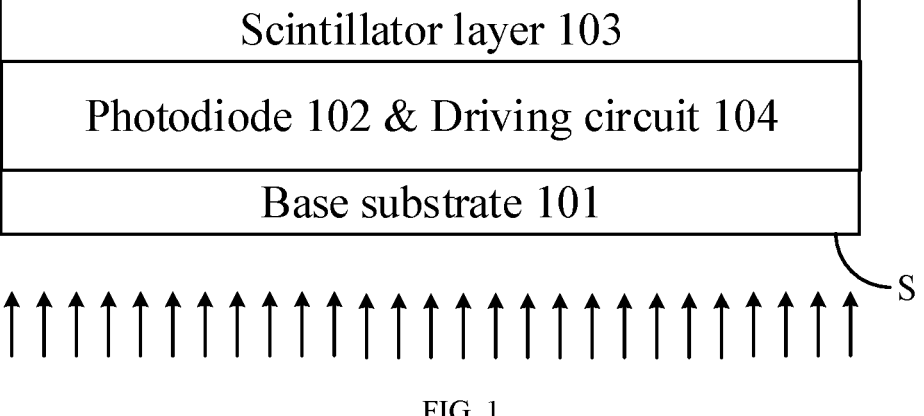
FIG. 1 is a schematic structural diagram of a detection substrate provided by an embodiment of the disclosure.

To make the objectives, technical solutions and advantages of embodiments of the disclosure clearer, the technical solutions of the embodiments of the disclosure will be clearly and completely described below in conjunction with the accompanying drawings of the embodiments of the disclosure. It should be noted that the sizes and shapes of all figures in the accompanying drawings do not reflect true scales, and are only intended to schematically illustrate the content of the disclosure. The same or similar reference numerals represent the same or similar elements or elements with the same or similar functions all the time.

Unless otherwise defined, technical or scientific terms used herein shall have the ordinary meanings understood by those ordinarily skilled in the art to which the disclosure pertains. The words "first", "second" and the like used in the specification and claims of the disclosure do not indicate any order, quantity, or importance, but are only used to distinguish different components. The words "comprise" or "include" and the like indicate that an element or item appearing before such words covers listed elements or items appearing after the words and equivalents thereof, and do not exclude other elements or items. "Inner", "outer", "upper", "lower" and the like are only used to represent relative position relationships, and the relative position relationships may also change accordingly after an absolute position of a described object changes.

X-ray detectors include direct DR and indirect DR based on their structural differences. Since an indirect DR X-ray detector technology is relatively mature and relatively low in cost, and has the advantages of low operating voltage, a wide operating temperature range, good reliability and so on, it has been widely developed and applied.

The indirect DR X-ray detector usually includes a glass substrate and a photodiode and a scintillator layer sequentially arranged on the glass substrate. In addition, in most related arts, a front irradiation mode is adopted for imaging, specifically, rays emitted by an X-ray source are incident into the X-ray detector on the side of the scintillator layer, the scintillator layer converts X-rays into visible light, then, the visible light is converted into an electric signal by the photodiode, and finally, an image is generated based on the electric signal. For the scintillator layer, the closer one side is to the X-ray source, the more X-rays are absorbed by the scintillator layer per unit thickness, and the more visible light is converted from the X-rays. However, escape of the visible light in the scintillator layer depends on the depth, and the longer the transmission distance of the visible light to the photodiode, the more the decrease of a spatial resolution, and the worse a modulation transfer function (MTF). When a back irradiation mode is adopted for imaging, the rays emitted by the X-ray source are incident into the X-ray detector on the side of the glass substrate. Since the larger loss of the rays due to absorption by the glass substrate in the related art, the effect in the back irradiation mode is virtually identical to that in the front irradiation mode.

To solve the above technical problems in the related art, an embodiment of the disclosure provides a detection substrate, as shown in FIG. 1 to FIG. 5, including:

a base substrate 101, an average atomic number of a material used for the base substrate 101 being less than 30, a mass attenuation coefficient of the material used for the base substrate 101 to rays being positively correlated with power of 3-4 of the average atomic number, and the base substrate 101 including a ray incident side S;

a photodiode 102, on a side of the base substrate 101, and the side of the base substrate with the photodiode 102 facing away from the side of the ray incident side S; and a scintillator layer 103, on a side of the layer of the photodiode 102 away from the base substrate 101, where a material of the scintillator layer 103 may include cesium iodide, GOS, tungstate, alkali halide and so on.

In the detection substrate provided by the embodiment of the disclosure, the x-ray mass attenuation coefficient of the base substrate 101 may meet a formula: $\mu_m = KZ^\alpha\lambda^3$, where K is a constant, Z is the average atomic number of the material used for the base substrate 101, and λ is a wavelength of the rays. It can be seen from the formula that the larger a value of the average atomic number Z of the material used for the base substrate 101 and a value of an exponent α of Z, the larger the absorption loss of the rays by the base substrate 101, and thus, to reduce the absorption loss of the rays by the material used for the base substrate 101 as much as possible in the disclosure, the average atomic number Z is set to be less than 30 and the value of the exponent α of Z is set to be greater than or equal to 3 and less than or equal to 4.

Figure 6:
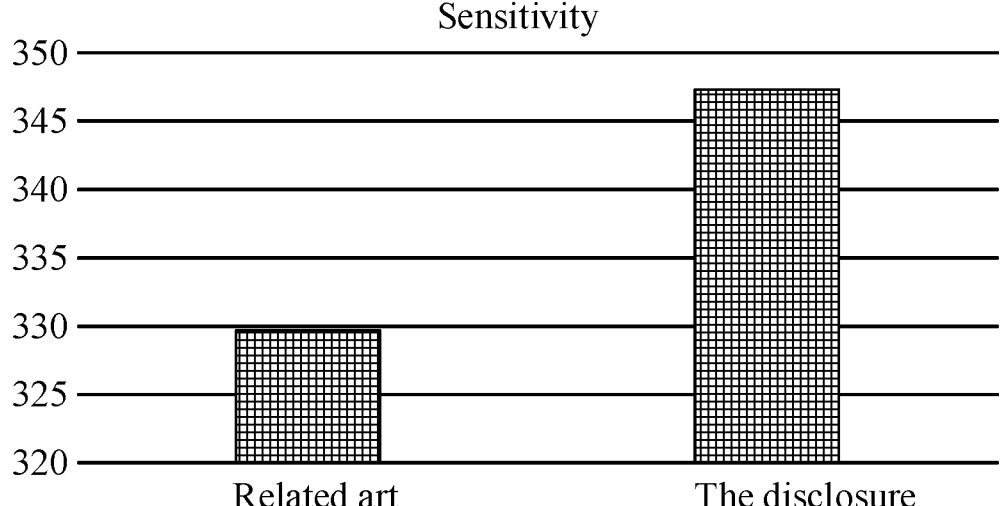
FIG. 6 shows the comparison between the sensitivity of a detection substrate provided by an embodiment of the disclosure in a back irradiation mode and sensitivity of a detection substrate in the related art in a front irradiation mode.
Figure 7:
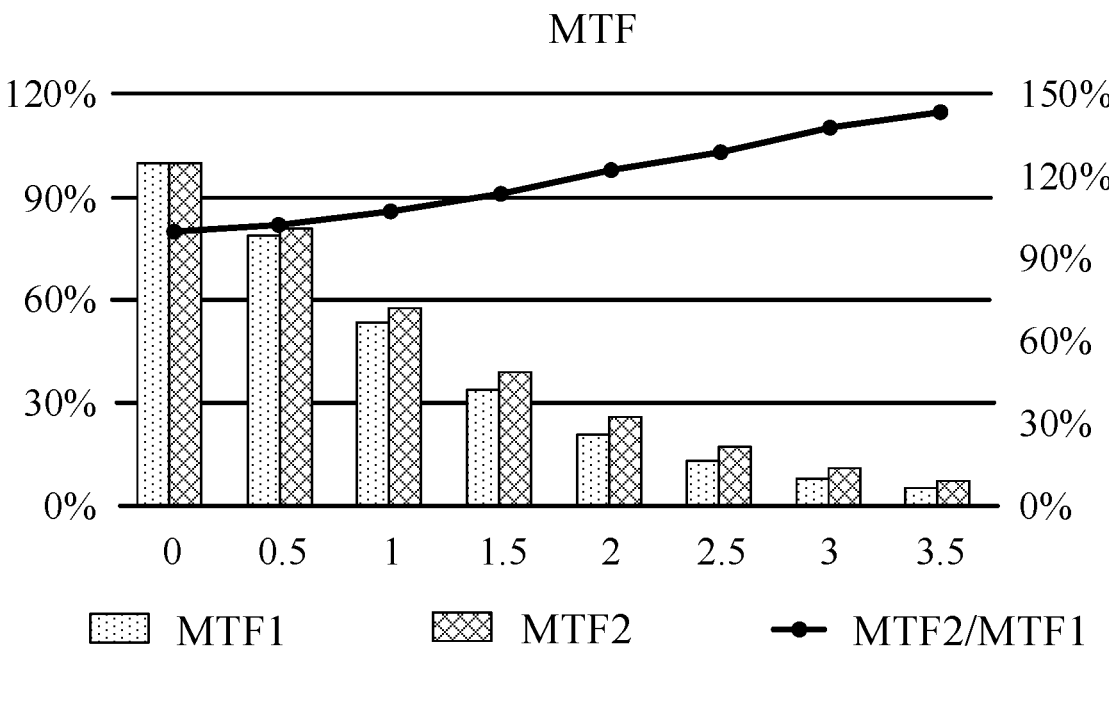
FIG. 7 shows the comparison between an MTF of a detection substrate provided by an embodiment of the disclosure in a back irradiation mode and an MTF of a detection substrate in the related art in a front irradiation mode.
Figure 8:
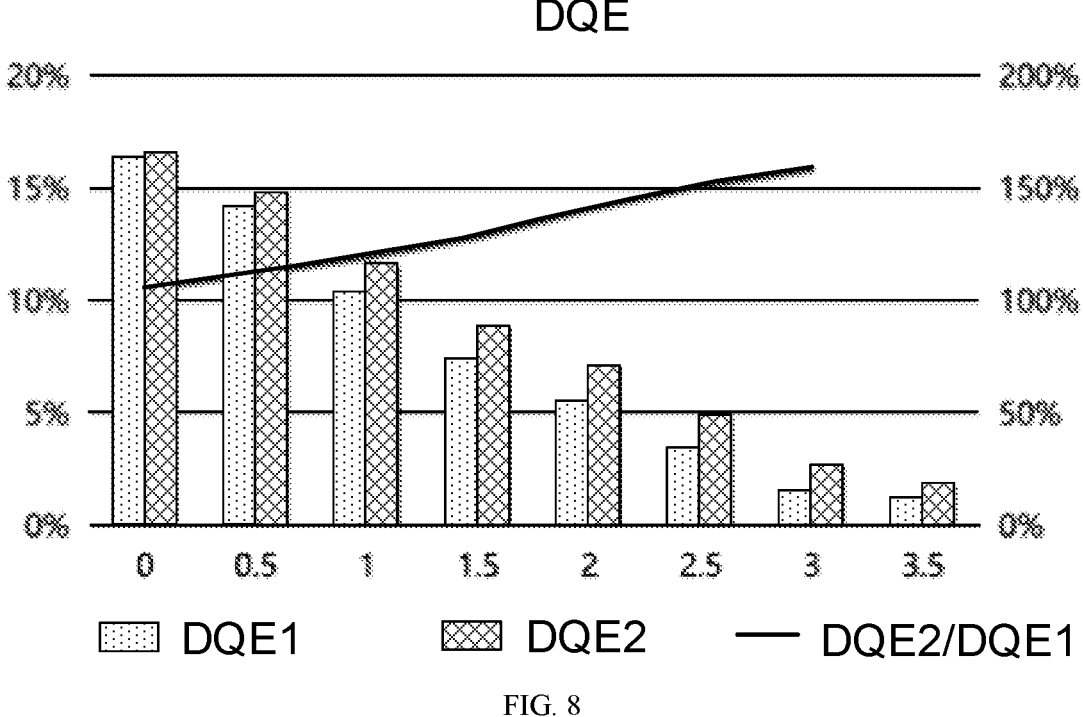
FIG. 8 shows the comparison between the DQE of a detection substrate provided by an embodiment of the disclosure in a back irradiation mode and DQE of a detection substrate in the related art in a front irradiation mode.

When the average atomic number Z of the material used for the base substrate 101 in the disclosure is less than 30, and the value of the exponent α of Z is greater than or equal to 3 and less than or equal to 4, the absorption loss of the rays by the base substrate 101 is very little, therefore, the back irradiation mode can be adopted to provide the rays for the detection substrate, and in other words, the ray source irradiates into the detection substrate from the ray incident side S of the base substrate 101 away from the photodiode 102. In this way, most rays may be converted into visible light on the side of the scintillator layer 103 close to the photodiode 102, which guarantees that the transmission distance of the visible light to the photodiode 102 is shorter, improves the detection sensitivity, and obtains a higher MTF value, as shown in FIG. 6 and FIG. 7. In FIG. 7, MTF1 represents an MTF value of the detection substrate in the related art in the front irradiation mode, and MTF2 represents an MTF value of the detection substrate in the disclosure in the back irradiation mode. In addition, the MTF value and the detection sensitivity both have an influence on detective quantum efficiency (DQE), thus, under the premise that the MTF value and the detection sensitivity are both improved in the disclosure. DQE is also effectively improved, as shown in FIG. 8. In FIG. 8. DQE1 represents a DQE value of the detection substrate in the related art in the front irradiation mode, and DQE2 represents a DQE value of the detection substrate in the disclosure in the back irradiation mode.

In some embodiments, in the detection substrate provided by the embodiment of the disclosure, the flexible substrate may be used as the base substrate 101 so as to reduce the absorption loss of the rays by the base substrate 101, improve the detection sensitivity. MTF value and DQE value and reduce the radiation dose required in the detection process.

In some embodiments, in the detection substrate provided by the embodiment of the disclosure, the material of the flexible substrate may be at least one of polyimide (PI), polyethylene glycol terephthalate (PET), polyethylene naphthalate (PEN), polymethyl methacrylate (PMMA), organic silica gel or resin. Of course, the material of the flexible substrate may also be other materials with an average atomic number less than 30 known by those skilled in the art, which is not limited here.

In some embodiments, in the detection substrate provided by the embodiment of the disclosure, the flexible substrate may include a polyimide layer, for example, the flexible substrate is only composed of the polyimide layer, and in this case, the material of the flexible substrate is polyimide.

In some embodiments, in the detection substrate provided by the embodiment of the disclosure, the flexible substrate may further include a polyethylene glycol terephthalate layer, and the polyethylene glycol terephthalate layer is disposed on a side of the polyimide layer away from the layer of the photodiode so as to support the polyimide layer through the polyethylene glycol terephthalate layer.

In some embodiments, in the detection substrate provided by the embodiment of the disclosure, a thickness of the polyimide layer may be less than 100 μm in a direction perpendicular to the base substrate 101, e.g., may be 17 μm. It can be seen from the FIG. 9 that the x-ray transmittance of the flexible substrate with the thickness of 17 μm and the material of polyimide is almost 100%, which is greater than that of the glass substrate (with the thickness usually being 0.5 mm and 1 mm) in the related art. That is to say, the absorption loss of the rays by the flexible substrate with the PI material in the disclosure is almost 0, which is much less than that of the rays by the glass substrate in the related art.

In some embodiments, in the detection substrate provided by the embodiment of the disclosure, the base substrate 101 not only may adopt the above flexible substrate, but also may adopt the rigid substrate as long as the absorption loss of the rays by the rigid substrate is less than that of the rays by the glass substrate in the related art.

In some embodiments, in the detection substrate provided by the embodiment of the disclosure, the thickness of the base substrate 101 may be less than or equal to 1000 μm in a direction perpendicular to the base substrate 101. After the rays pass through the base substrate 101, an attenuation of the rays by the base substrate 101 accords with the Lambert-Beer law, which meets a formula: $I = I_0 e^{\mu x}$, where, I is transmission intensity of the rays. $I_0$ is initial intensity of the rays, μ is an absorption coefficient of the rays by the base substrate 101, and x is the thickness of the base substrate 101. It can be seen from the formula that the transmission intensity of the rays depends on three factors of the initial intensity $I_0$ of the rays, the absorption coefficient μ of the rays by the base substrate 101 and the thickness of the base substrate 101, therefore, in the case that the material of the base substrate 101 is fixed (that is, the absorption coefficient μ of the rays by the base substrate 101 is fixed) and the initial intensity $I_0$ of the rays is fixed, the smaller the thickness x of the base substrate 101, the less the absorption of the rays, and thus, the thickness x of the base substrate 101 in the disclosure is set as a micron order, that is, the thickness x of the base substrate 101 should not exceed 1000 μm, and can be, for example, 800 μm.

In some embodiments, in the detection substrate provided by the embodiment of the disclosure, the glass-transition temperature of the base substrate 101 can be greater than 200° C. so that the base substance can be used in the preparation process with a temperature above 200° C.

In some embodiments, in the detection substrate provided by the embodiment of the disclosure, as shown in FIG. 2 to FIG. 5, the photodiode 102 may include a first electrode 1021, a photovoltaic conversion material layer 1022 and a second electrode 1023 arranged in stack, and the second electrode 1023 is adjacent to the scintillator layer 103. Optionally, the second electrode 1023 is made of transparent conductive materials such as indium tin oxide (ITO) and indium zinc oxide (IZO), the first electrode 1021 is made of metal or alloy such as copper (Cu), aluminum (Al), molybdenum (Mo) and titanium (Ti), the photovoltaic conversion material layer 1022 may include a P-type semiconductor layer, an I-type semiconductor layer (also known as an intrinsic semiconductor layer) and an N-type semiconductor layer arranged in stack, and materials of the semiconductor layers may be amorphous silicon (a-Si).

Figure 2:
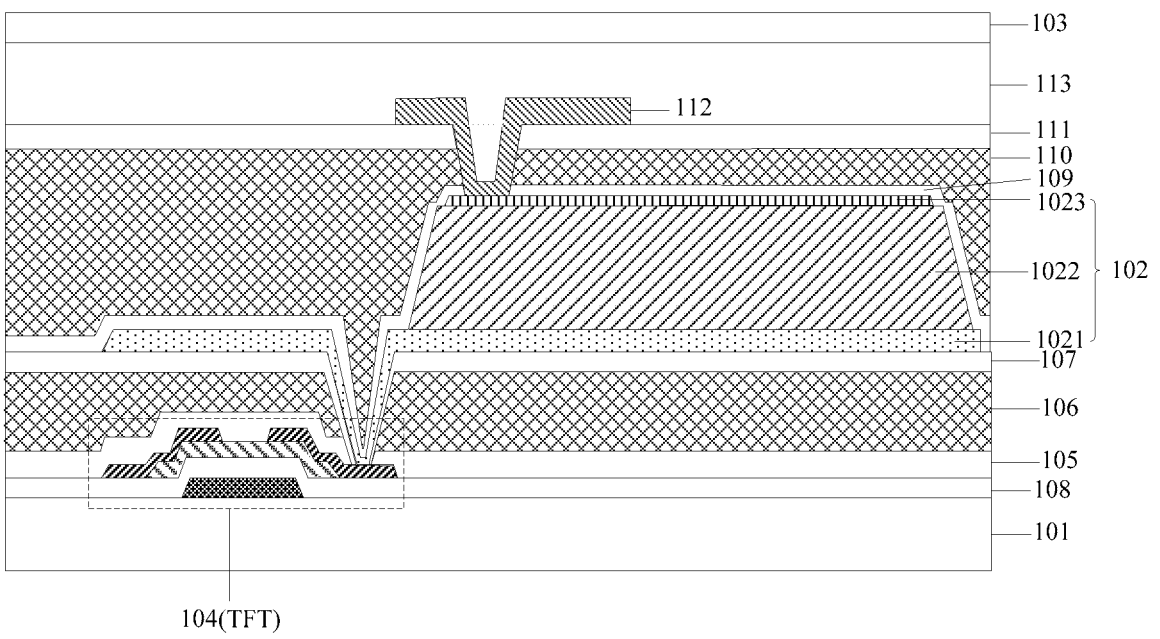
FIG. 2 is a schematic structural diagram of one pixel in a detection substrate provided by an embodiment of the disclosure.
Figure 3:
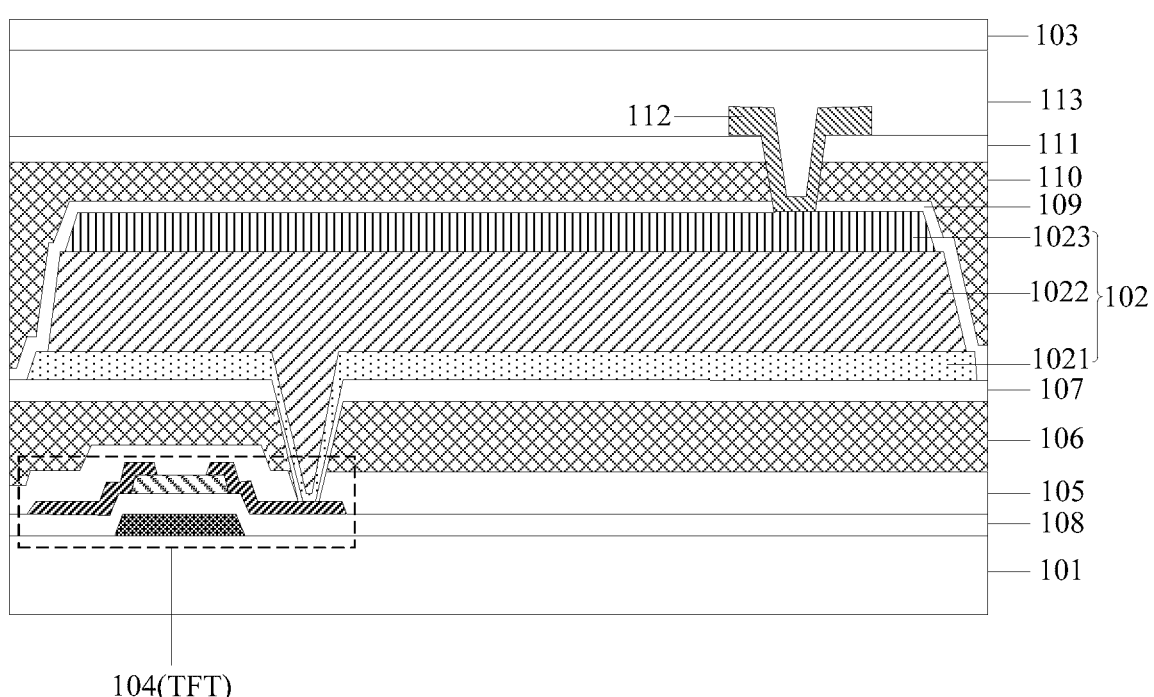
FIG. 3 is another schematic structural diagram of one pixel in a detection substrate provided by an embodiment of the disclosure.
Figure 4:
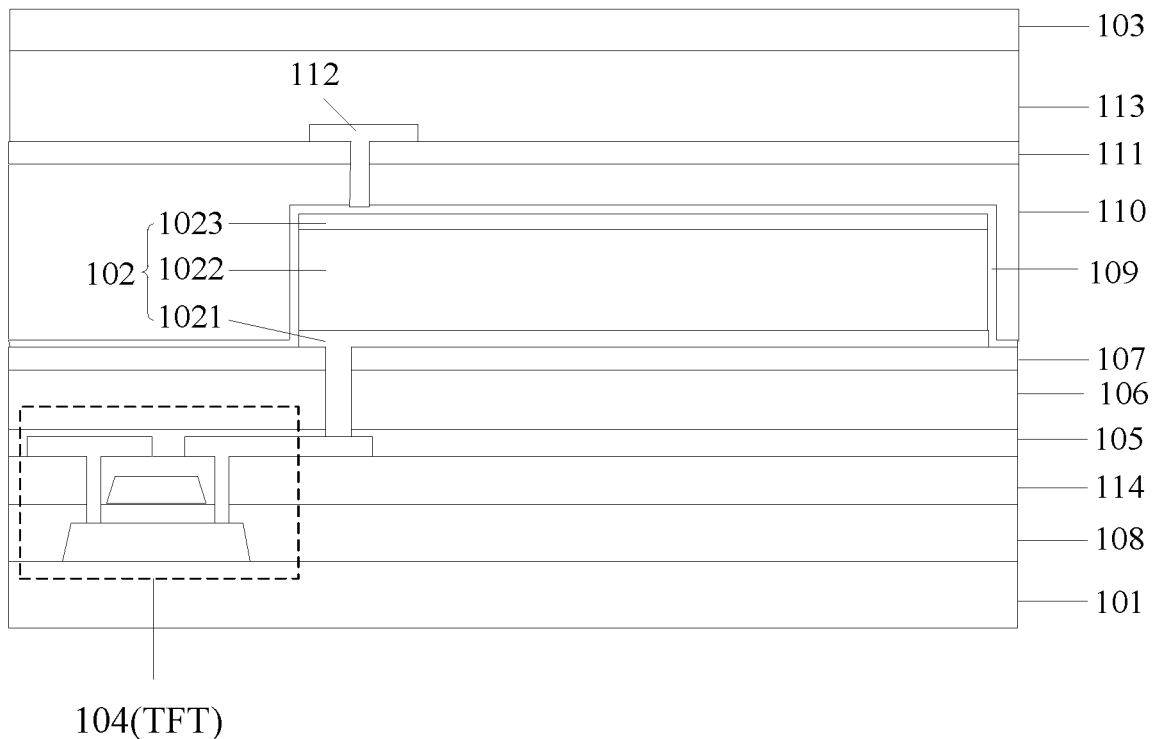
FIG. 4 is another schematic structural diagram of one pixel in a detection substrate provided by an embodiment of the disclosure.
Figure 5:
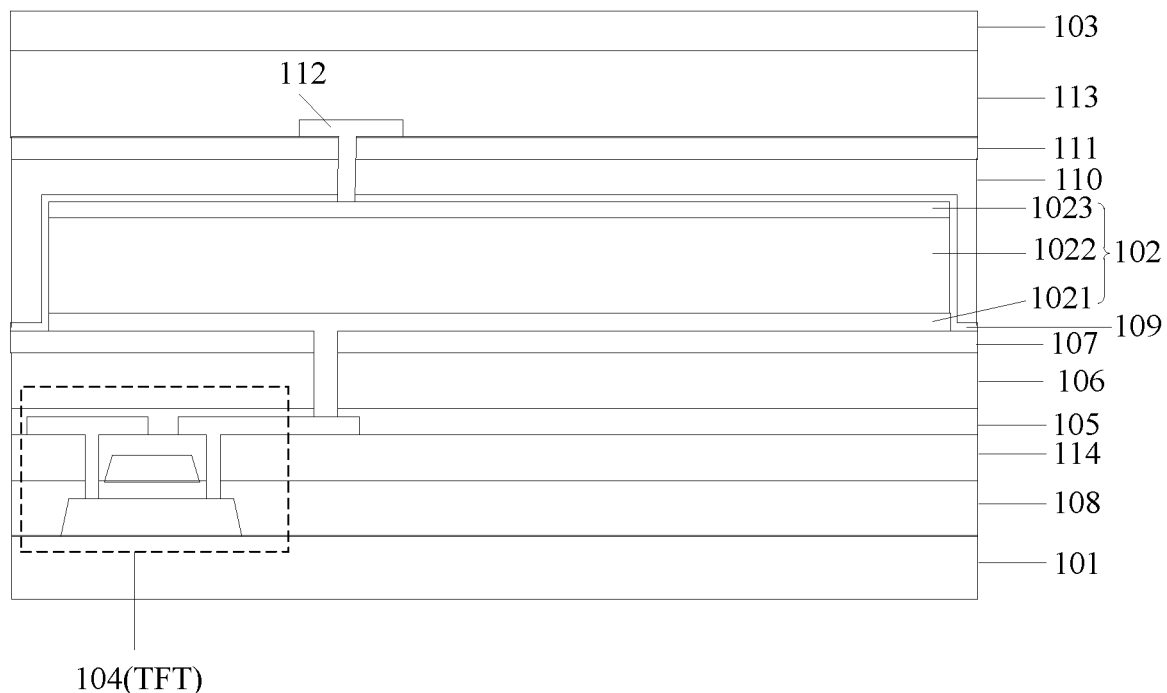
FIG. 5 is another schematic structural diagram of one pixel in a detection substrate provided by an embodiment of the disclosure.

In some embodiments, the detection substrate provided by the embodiment of the disclosure, as shown in FIG. 2 to FIG. 5, may further include a driving circuit 104, the layer of the driving circuit 104 is located between the base substrate 101 and the layer of the first electrode 1021, and the driving circuit 104 is electrically connected with the first electrode 1021. The driving circuit 104 may be in an active mode (APS) or passive mode (PPS), which is not limited here. The driving circuit 104 may include a transistor TFT which may be an oxide transistor, a low-temperature polysilicon (Poly) transistor or an amorphous silicon (a-Si) transistor. Optionally, an active layer material of the oxide transistor may be an indium gallium zinc oxide with a higher migration rate, however, the indium gallium zinc oxide will be conductive when irradiated by the rays, resulting in the failure of switching performance of the transistor. Based on this, when the transistor TFT adopts an active layer of an indium gallium zinc oxide material, as shown in FIG. 2 and FIG. 3, the transistor TFT may be set as a bottom-gate transistor so as to block the active layer by a gate of the transistor TFT, and irradiating the active layer by the rays provided in the back irradiation mode is avoided. Amorphous silicon is not sensitive to the rays, therefore, when the transistor TFT is the amorphous silicon transistor, the amorphous silicon transistor may be either a top-gate transistor as shown in FIG. 4 and FIG. 5, or a bottom-gate transistor as shown in FIG. 2 and FIG. 3.

In some embodiments, in the detection substrate provided by the embodiment of the disclosure, as shown in FIG. 3 and FIG. 5, an orthographic projection of the driving circuit 104 on the base substrate 101 is located in an orthographic projection of the photovoltaic conversion material layer 1022 on the base substrate 101, so as to improve a pixel fill rate. In some embodiments, as shown in FIG. 2 and FIG. 4, an orthographic projection of the driving circuit 104 on the base substrate 101 may not overlap an orthographic projection of the photovoltaic conversion material layer 1022 on the base substrate 101 so as to reduce parasitic capacitance of the driving circuit 104 and the first electrode 1021.

In addition, as shown in FIG. 3 and FIG. 5, the first electrode 1021 covers the transistor TFT of the driving circuit 104 to allow the active layer of the transistor TFT to be free of light interference, which improves the stability of the transistor TFT. However, since the first electrode 1021 covers the transistor TFT of the driving circuit 104, the parasitic capacitance will be formed between the first electrode 1021 and the transistor TFT. In order to reduce the parasitic capacitance, the distance between the first electrode 1021 and the transistor TFT may be increased through a first insulation layer 105, a first planarization layer 106 and a second insulation layer 107 arranged in stack between the layer of the first electrode 1021 and the layer of the transistor TFT, so that a harmful effect of the first electrode 1021 on the transistor TFT is avoided.

In some embodiments, the detection substrate provided by the embodiment of the disclosure, as shown in FIG. 2 and FIG. 5, may further include a gate insulation layer 108 between the layer of the gate of the transistor TFT and the active layer, a side wall protection layer 109, a second planarization layer 110, a third insulation layer 111, a bias line 112 and a third planarization layer 113 on one side of the layer of the second electrode 1023 facing the scintillator layer 103 in sequence, and an interlayer medium layer 114 between the gate and a source and a drain of the transistor TFT. Other essential components of the detection substrate shall be understood by those of ordinary skill in the art, which are omitted herein and also shall not become a restriction to the disclosure.

Based on the same inventive concept, an embodiment of the disclosure provides a ray detector including the above detection substrate provided by the embodiment of the disclosure. Since the principle of solving the problem of the detector is similar to that of the detection substrate, the implementation of the ray detector provided by the embodiment of the disclosure may refer to the implementation of the detection substrate provided by the embodiment of the disclosure, and will not be repeated.

Figures 9, 10:
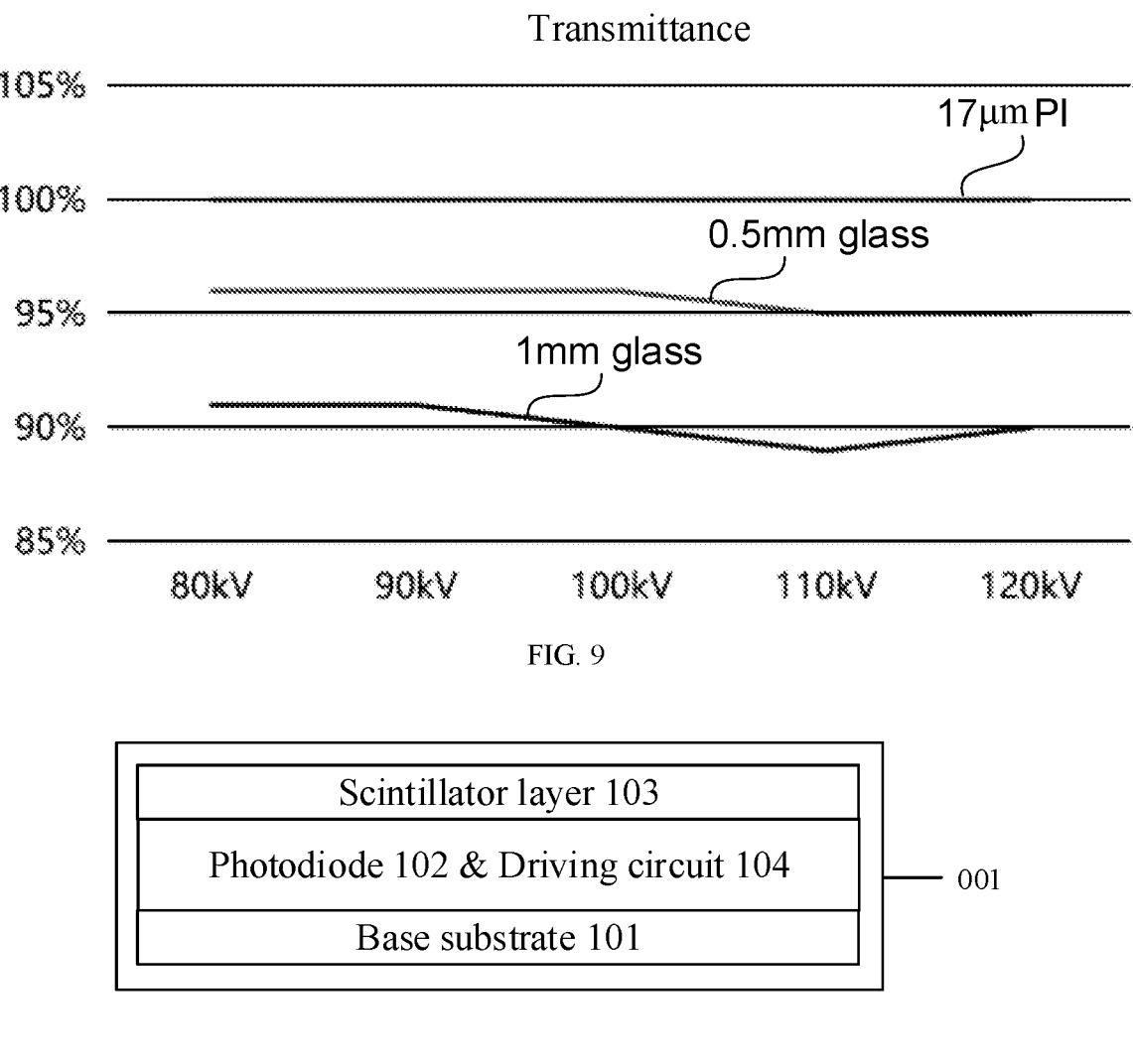
FIG. 9 shows the comparison between the transmittance of a flexible substrate provided by an embodiment of the disclosure to rays and transmittance of a glass substrate in the related art to rays.
FIG. 10 is a schematic structural diagram of a ray detector provided by an embodiment of the disclosure.

In some embodiments, the ray detector provided by the embodiment of the disclosure, as shown in FIG. 10, includes a detection substrate 001 and a ray source 002, where the detection substrate 001 is the above detection substrate 001 provided by the embodiment of the disclosure, and rays emitted by the ray source 002 irradiate into the detection substrate 001 from a ray incident side S. In some embodiments, the ray source 002 may emit the X-rays, and after passing through a detected object, the X-rays emitted by the ray source 002 first reach a base substrate 101, and then pass through the layer of a driving circuit 104 and the layer of a photodiode 102 in sequence to reach a scintillator layer 103. The scintillator layer 103 converts the X-rays into visible light, the visible light is converted into an electric signal by the photodiode 102, and finally, after the electric signal is output to an external readout IC (ROIC) through the driving circuit 104, the readout IC may generate an image of the detected object based on the electric signal.

In some embodiments, the ray detector provided by the embodiment of the disclosure may further include but is not limited to: a radio frequency unit, a network module, an audio output & input unit, a user input unit, an interface unit, a memory, a processor, a power supply and other components. In addition, those skilled in the art can understand that the above structure does not constitute a limitation to the above ray detector provided by the embodiment of the disclosure. In other words, the above ray detector provided by the embodiment of the disclosure may include more or less above components, or combine some components, or include different components.

Although the above preferred embodiments have been described by the disclosure, it shall be understood that those skilled in the art can make various modifications and variations to the embodiments of the disclosure without departing from the spirit and scope of the embodiments of the disclosure. In this way, under the condition that these modifications and variations to the embodiments of the disclosure fall within the scope of the claims of the disclosure and their equivalent technologies, the disclosure is also intended to include these modifications and variations.

What is claimed is:

1. A detection substrate, comprising:
a base substrate, wherein an average atomic number of a material used for the base substrate is less than 30, a ray mass attenuation coefficient of the material used for the base substrate is positively correlated with power of 3-4 of the average atomic number, and the base substrate comprises a ray incident side;
a photodiode on a side of the base substrate, wherein the side of the base substrate with the photodiode faces away from the ray incident side; and
a scintillator layer, on a side of a layer of the photodiode away from the base substrate;
wherein the detection substrate further comprises a first planarization layer between a layer of the photodiode and the base substrate;
wherein the photodiode comprises a first electrode, a photovoltaic conversion material layer and a second electrode arranged in stack, and the second electrode is adjacent to the scintillator layer;
wherein the detection substrate further comprises a driving circuit, wherein
a layer of the driving circuit is disposed between the base substrate and the first planarization layer; and
the driving circuit is electrically connected with the first electrode through a via running through the first planarization layer.

2. The detection substrate according to claim 1, wherein the base substrate is a flexible substrate.

3. The detection substrate according to claim 2, wherein a material of the flexible substrate comprises at least one of polyimide, polyethylene glycol terephthalate, polyethylene naphthalate, polymethyl methacrylate, organic silica gel or resin.

4. The detection substrate according to claim 3, wherein the flexible substrate comprises a polyimide layer.

5. The detection substrate according to claim 4, wherein the flexible substrate further comprises a polyethylene glycol terephthalate layer, and the polyethylene glycol terephthalate layer is disposed on a side of the polyimide layer away from the layer of the photodiode.

6. The detection substrate according to claim 4, wherein a thickness of the polyimide layer is less than 100 μm in a direction perpendicular to the base substrate.

7. The detection substrate according to claim 1, wherein the base substrate is a rigid substrate.

8. The detection substrate according to claim 1, wherein a thickness of the base substrate is less than or equal to 1000 μm in a direction perpendicular to the base substrate.

9. The detection substrate according to claim 1, wherein a glass-transition temperature of the base substrate is greater than 200° C.

10. The detection substrate according to claim 1, wherein an orthographic projection of the driving circuit on the base substrate is located in an orthographic projection of the photovoltaic conversion material layer on the base substrate.

11. The detection substrate according to claim 1, wherein an orthographic projection of the driving circuit on the base substrate does not overlap an orthographic projection of the photovoltaic conversion material layer on the base substrate.

12. The detection substrate according to claim 1, wherein the driving circuit comprises an amorphous-silicon transistor, and the amorphous-silicon transistor is a top-gate transistor or a bottom-gate transistor.

13. The detection substrate according to claim 1, wherein the driving circuit comprises an oxide transistor, and the oxide transistor is a bottom-gate transistor.

14. A ray detector, comprising a detection substrate and a ray source, wherein the detection substrate comprises:

a base substrate, wherein an average atomic number of a material used for the base substrate is less than 30, a ray mass attenuation coefficient of the material used for the base substrate is positively correlated with power of 3-4 of the average atomic number, and the base substrate comprises a ray incident side;

a photodiode on a side of the base substrate, wherein the side of the base substrate with the photodiode faces away from the ray incident side; and a scintillator layer, on a side of a layer of the photodiode away from the base substrate;

and rays emitted by the ray source irradiate into the detection substrate from the ray incident side;

wherein the detection substrate further comprises a first planarization layer between a layer of the photodiode and the base substrate;

wherein the photodiode comprises a first electrode, a photovoltaic conversion material layer and a second electrode arranged in stack, and the second electrode is adjacent to the scintillator layer;

wherein the detection substrate further comprises a driving circuit, wherein a layer of the driving circuit is disposed between the base substrate and the first planarization layer; and the driving circuit is electrically connected with the first electrode through a via running through the first planarization layer.

* * * * *